US008199921B2

(12) United States Patent
Katayama et al.

(10) Patent No.: US 8,199,921 B2
(45) Date of Patent: Jun. 12, 2012

(54) SOUND FIELD CONTROLLING DEVICE

(75) Inventors: Masaki Katayama, Hamamatsu (JP); Kenichiro Takeshita, Hamamatsu (JP); Katsuhiko Masuda, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1447 days.

(21) Appl. No.: 11/790,674

(22) Filed: Apr. 26, 2007

(65) Prior Publication Data

US 2007/0253564 A1 Nov. 1, 2007

(30) Foreign Application Priority Data

Apr. 28, 2006 (JP) ................................ 2006-126870

(51) Int. Cl.
*H03G 3/00* (2006.01)
*H04R 5/00* (2006.01)
*H04B 3/20* (2006.01)

(52) U.S. Cl. ................ 381/63; 381/17; 381/18; 381/66; 381/61

(58) Field of Classification Search .................... 381/63, 381/66, 17–18, 61
See application file for complete search history.

(56) References Cited

U.S. PATENT DOCUMENTS

| | | | | |
|---|---|---|---|---|
| 4,472,993 | A * | 9/1984 | Futamase et al. | 84/629 |
| 5,680,464 | A | 10/1997 | Iwamatsu | |
| 2005/0047608 | A1* | 3/2005 | Araya et al. | 381/63 |
| 2005/0195984 | A1 | 9/2005 | Miura et al. | |

FOREIGN PATENT DOCUMENTS

| | | | |
|---|---|---|---|
| JP | 4-250800 | A | 9/1992 |
| JP | 4-256300 | A | 9/1992 |
| JP | 4-341000 | A | 11/1992 |
| JP | 7-95684 | A | 4/1995 |
| JP | 8-275300 | A | 10/1996 |
| JP | 2002-330499 | A | 11/2002 |
| JP | 2002-374599 | A | 12/2002 |
| JP | 2004-279525 | A | 10/2004 |
| JP | 2005-72676 | A | 3/2005 |
| JP | 2005-252467 | A | 9/2005 |
| WO | WO 2006/009004 | A1 | 1/2006 |

OTHER PUBLICATIONS

English translation of Japanese Office Action dated Aug. 12, 2008 (eight (8) pages).

* cited by examiner

*Primary Examiner* — Devona Faulk
*Assistant Examiner* — George Monikang
(74) *Attorney, Agent, or Firm* — Crowell & Moring LLP

(57) ABSTRACT

A sound field controlling device for supplying audio signals to a plurality of speakers provided in a space to form a sound field in the space, includes a measuring unit which measures levels of indirect sounds, which are outputted from the speakers, reflected from a wall surface of the space, and reach a listening position respectively, a reverberation applying unit which generates a reverberation simulation signal for reinforcing the indirect sounds on the basis of the audio signals, and a reverberation balance adjusting unit which controls the level of the reverberation simulation signal and supplies the controlled reverberation simulation signal to the corresponding speakers on the basis of the levels of the indirect sounds outputted from the speakers so that respective synthesized levels of the indirect sounds and the reverberation simulation signal are balanced between the speakers.

6 Claims, 4 Drawing Sheets

SOUND FIELD CONTROLLING DEVICE

BACKGROUND OF THE INVENTION

The present invention relates to a sound field controlling device capable of adjusting a sound field when a multi-channel sound is played.

Recently, users who install a sound system capable of playing a multi-channel sound in a living room or a listening room to enjoy contents such as movies and music in home have been increased. For example, when the users play a movie DVD by using the AV system, the multi-channel sounds are played from a plurality of speakers. Accordingly, the users watch the movie while feeling surrounding sounds from circumstances.

In the above-mentioned sound system, it is important to adjust a balance of each channel so as to accurately perform a localization of a sound image. A system for adjusting a sound volume or frequency characteristics by outputting test sounds from speakers respectively and measuring a sound field of a micro listening room in order to adjust the balance, has come into practical use. For example, the above-mentioned system is a YPAO (Yamaha Parametric Room Acoustic Optimizer, which is a trademark), and so on.

Patent Document 1 discloses a sound playing device and a stereo sound playing apparatus capable of adjusting a ratio of a direct sound and an effect sound simulating a reverberation of specific gathering facilities.

[Patent Document 1] JP-A-2002-374599

However, since a sound field is to simulate an echo of a sound in a virtual space, it is important to balance a reverberant of a listening room to form satisfactory the sound field. Specifically, when a sound of gathering facilities such as hall is simulated so as to add the simulated echo and the simulated sound is outputted from the listening room, the balance may be more important.

However, the listening room has generally a bad balance regarding the echo. For example, since the room has one side wall, a curtain, furniture, and the like, a condition of absorption of sound, a condition of a reflection, and a condition of making a standing wave may be different. Accordingly, the echo in the listening room may be easily unbalanced.

Accordingly, although the balance of the sound level of the sound from the speaker is adjusted, the unbalance of the reverberation still remains. Thus, there arises a problem that a sound field having a good balance can not be formed.

In addition, as mentioned above, because of a shape of the listening room and the existence of the furniture or the curtain, the listening room generally has a frequency characteristic not being flat. That is, a specific frequency is highlighted as an ordinary wave by the shape of the room, or the specific frequency is absorbed so as to be blurred by the curtain and the furniture.

However, when the frequency characteristic is adjusted by directly operating a frequency characteristic of an audio signal, there arises a problem that the frequency characteristic is substantially blurred. For example, when the frequency characteristic of the listening room has a big dip and the frequency characteristic is adjusted by setting a filter having a big peak in the frequency characteristic, the frequency characteristic of the sound field after setting the filter is a flat frequency characteristic. However, there arises a problem that the direct sound component may be unnatural and is substantially harsh to hear.

Accordingly, an object of the invention is to provide a sound field controlling device capable of adjusting an output balance of the reverberation effect sound and the frequency characteristic of the reverberation effect sound on the basis of the sound field circumstances in which a sound system playing the multi-channel sound is disposed.

In order to achieve the above object, according to the present invention, there is provided a sound field controlling device for supplying audio signals to a plurality of speakers provided in a space to form a sound field in the space, the device comprising:

a measuring unit which measures levels of indirect sounds, which are outputted from the speakers, reflected from a wall surface of the space, and reach a listening position respectively;

a reverberation applying unit which generates a reverberation simulation signal for reinforcing the indirect sounds on the basis of the audio signals; and a reverberation balance adjusting unit which controls the level of the reverberation simulation signal and supplies the controlled reverberation simulation signal to the corresponding speakers on the basis of the levels of the indirect sounds outputted from the speakers so that respective synthesized levels of the indirect sounds and the reverberation simulation signal are balanced between the speakers.

In the above configuration, the measuring unit which measures the levels of the indirect sounds outputted from the plurality of the speakers. The level of the reverberation simulation signal is controlled on the basis of the level of the indirect sound so that a synthesized level between the indirect sound and the reverberation simulation signal is balanced at every speaker in the reverberation balance adjusting unit. Accordingly, unbalance of an indirect sound of a frequency characteristic of an interior in which the sound system is installed and a feeling of lack in an indirect sound may be naturally supplemented. For example, the low reverberation may be supplemented by increasing an output of the reverberation simulation signal with respect to the output of the reverberation effect sound installed in the direction having a low reverberation. Accordingly, in the invention, an output balance of the reverberation simulation signal for reinforcing the indirect sound may be supplemented on the basis of the sound field circumstances in which the sound system is disposed.

Preferably, the audio signals supplied to the plurality of speakers are multi-channel audio signals. The reverberation applying unit generates the reverberant simulation signal on the basis of a signal obtained by synthesizing a part or all of the multi-channel audio signals.

Specifically, when sounds are outputted from the speakers which are provided around a user and to which multi-channel audio signals are supplied, it may occur that the user feels unbalance of surrounding indirect sounds in the sounds, for example, the user feels that there is a speaker which is disposed in the direction having a low reverberation. In this case, since the direction having the low reverberation may be substantially prominent, a surrounding effect of the multi-channel sounds may not be obtained. In the invention, since the output balance of the reverberation simulation signal is adjusted, the surrounding effect may be substantially exhibited.

According to the present invention, there is also provided a sound field controlling device comprising:

a direct supply unit which supplies an inputted audio signal to a speaker;

a measuring unit which measures a frequency characteristic of a sound when the sound outputted from the speaker arrives at a listening position;

a reverberation applying unit which generates a reverberation sound of the audio signal; and a filter which filters the reverberation sound with a filter characteristic of compensating for a part or all of the measured frequency characteristic to supply the filtered reverberation sound to the speaker.

In the invention, the reverberation applying unit generates the reverberation sound of the audio signals, and the reverberation sound is filtered with the filter characteristic of compensating for a part or all of the frequency characteristic of the sound which is reached to the listening position from the speaker. Accordingly, when the frequency characteristic of the sound transmitted from the speaker to the listening position is not flat, the frequency characteristic of the reverberation sound is adjusted. Accordingly, a feeling of lack in the frequency characteristic of the sound field in which the sound system is installed is supplemented, and an unpleasant sound and a unnatural sound by a peak of the frequency characteristic of the direct sound component may be suppressed so as to generate the sound more smoothly.

Preferably, the direct supply unit supplies inputted multi-channel audio signals to different speakers respectively. The measuring unit and the filter are provided as many as the number of the channels of the multi-channel audio signals.

In the invention, the frequency characteristic at the time when sounds corresponding to the multi-channel audio signals arrive at the listening position from the speakers can be flat.

Preferably, the reverberation applying unit generates a reverberation simulation signal on the basis of a signal obtained by synthesizing a part or all of the multi-channel audio signals.

In the invention, the sound field is divided at every group of speakers, not divided at every speaker (for example, a front group of the speakers and a rear group of the speakers). Therefore, it is easy to control the sound field.

Preferably, the filter is set with the filter characteristic of compensating for a part of the measured frequency characteristic. The direct supply unit includes a direct sound filter which adjusts the frequency characteristic of the audio signal with the filter characteristic compensating for a part of the measured frequency characteristic.

In the invention, since the direct supply unit adjusts the frequency characteristic, the frequency characteristics of the direct sound and the indirect sound can be adjusted.

According to the invention, since unbalance of a reverberation in a space in which a speaker is installed and an unevenness of a frequency characteristic of sounds can be adjusted, a sound field having a good quality may be formed in a room where echoes of the sounds are different depending on directions in which the sounds are transmitted or where a specific frequency component of the sounds is absorbed.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
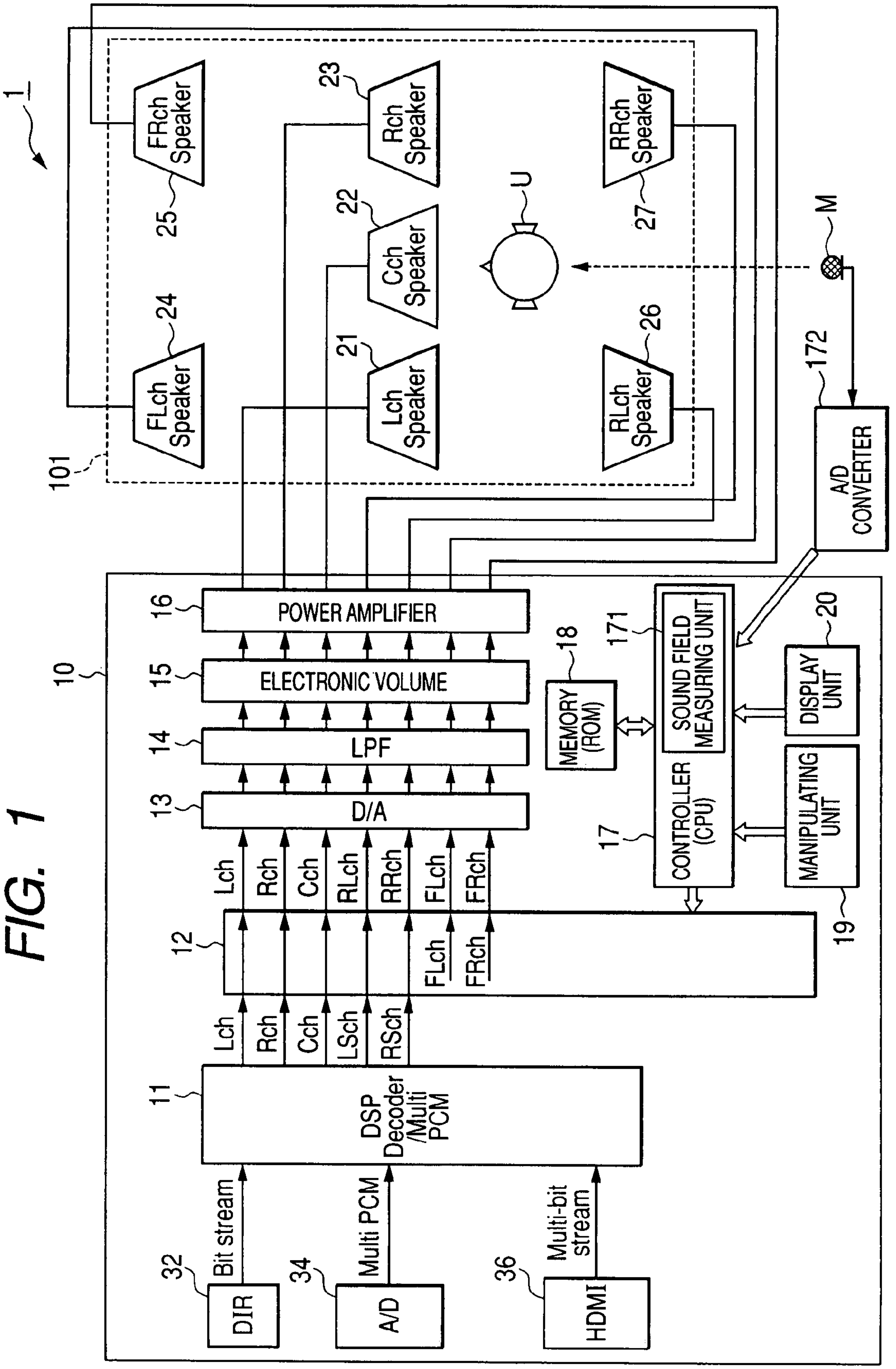
FIG. 1 is a block diagram illustrating a configuration of a sound field controlling device according to an embodiment.
Figure 2:
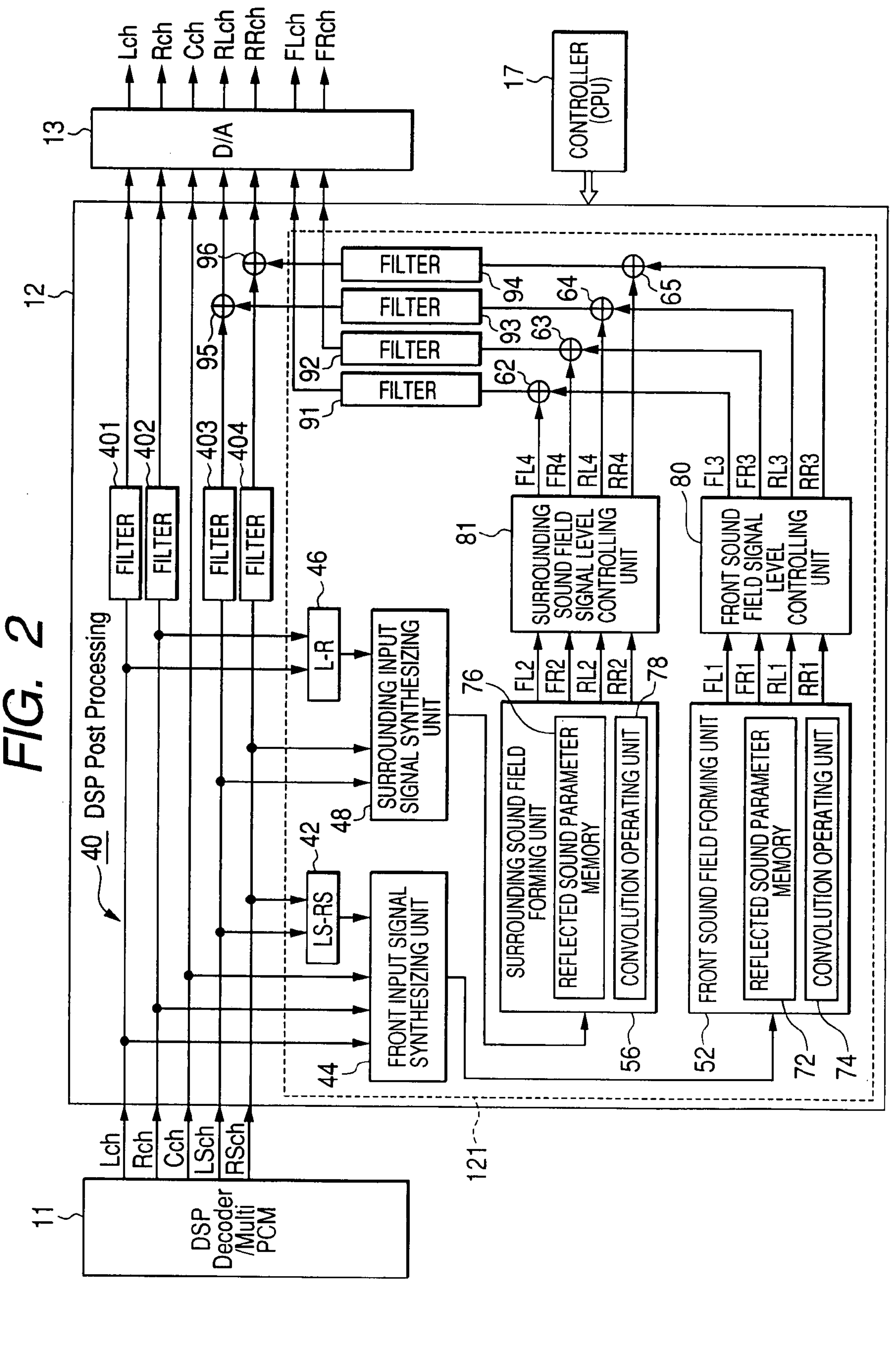
FIG. 2 is a block diagram illustrating a configuration of a signal processing device according to the embodiment.

As shown in FIG. 1, a sound system including a sound field controlling device according to an embodiment of the invention will be described hereinafter. FIG. 1 is a block diagram illustrating the sound system 1 including a sound field controlling device 10. FIG. 2 is a detail view illustrating processing portions of the sound field controlling device 10. The sound field controlling device 10 outputs multi-channel sounds of 7 channels (hereinafter, "channel" is referred to as "ch") as an example.

In FIG. 1, a Lch speaker 21 and a Rch speaker 23 are disposed in a front position (in a direction where a nose of a triangle is disposed in FIG. 1) of a user U. A FLch speaker 24 and a FRch speaker 25, outputting a reverberation effect sound which mainly apply an effect sound, are disposed in an upper of the Lch speaker (front left) and the Rch speaker (front right). A Cch speaker (front direction) is disposed in the center of the Lch speaker (front left) and the Rch speaker (front right). A RLch speaker 26 (back left) and a RRch speaker 27 (back right) are disposed in a back position of the Lch speaker (front left) and the Rch speaker (front right).

The sound field controlling device 10 according to the embodiment outputs a reverberation effect sound simulating the reverberation measured in a predetermined hall, and so on from the speakers other than a direct sound amplifying an input signal so as to output the input signal, thereby forming two sound field such as a front sound field and a surrounding sound field. The front sound field provides feeling of depth and feeling of three-dimensional at a front position of the user U, thereby surrounding the user U from the front direction. The surrounding sound field is a sound field which surrounds the user U from a back direction of the user U at a listening position (in a side where the RLch speaker and the RRch speaker are disposed). A formation of the sound fields is performed by synthesizing a reverberation simulation signal for outputting the reverberation effect sound. The reverberation simulation signal is synthesized by processing a synthesized multi-channel audio signal with a filter which simulates a reverberation simulation characteristic measured in a predetermined hall.

In addition, the sound field controlling device 10 according to the embodiment installs a microphone M at the listening position, subsequently outputs test sounds from the speakers respectively, and then the microphone M obtains levels of direct sound components and indirect sound components from response signals of the test sounds corrected by the microphone. An output ratio of the reverberation simulation signal is adjusted based on a ratio of the levels of the indirect sound components. Accordingly, for example, the speaker which is installed in a direction having a low reverberation and a characteristic of substantially absorbing a sound is reinforced so that the reverberation is increased by increasing the output of the reverberation effect sound. The speaker, which is installed in a direction having a high reverberation, is adjusted so as to reduce the output of the reverberation effect sound. As mentioned above, the sound field controlling device of the embodiment provides not only the reverberation effect of the predetermined hall to the user, but also an adjustment for the unbalance of the reverberation by compensating for a defect of the reverberation of the sound field, and the like.

<Description of Configuration of Sound Field Controlling Device According to the Embodiment of the Invention>

A configuration of the sound field controlling device according to the embodiment will be described by using FIGS. 1 and 2. The sound field controlling device 10 includes a DSP decoder 11, a signal processing unit 12, a D/A converter 13, a low-pass filter 14, an electronic volume 15, a power amplifier 16, a controller 17, a memory 18, an operating unit 19, and a display unit 20. In addition, speakers 21 to 27 are connected to the power amplifier 16 of the sound field controlling device 1. The controller 17 includes a sound field measuring unit 171. In addition, the sound system 1 includes an A/D converter 172 and a microphone M to operate a sound field measuring unit 171 other than the sound field controlling device 10.

As shown in FIG. 1, the speakers 21, 22, 23 of channels L, C, R as front speakers are disposed to a front left direction, a front center direction and a front right direction of the a listening position of the user U in the listening room 101. In addition, speakers 24, 25, 26, 27 of channels FL, FR, RL, RR are disposed to the front left direction, the front right direction, the back left direction and the back right direction of the listening position of the user U as the sound field controlling speakers.

In addition, the signals of the FLch, FRch outputted from the signal processing unit 12 are reverberation simulation signals to form the above-mentioned front sound field. In addition, RLch and RRch are synthesized signals which are synthesized from the multi-channel sound signals LSch, RSch and the reverberation simulation signals for forming the surrounding sound field.

The DSP decoder 11 is connected to a DIR (Digital audio Interface Receiver) 32, A/D converter 34, and a HDMI (High Definition Multimedia Interface, which is a registered trademark) receiver 36. The DSP decoder 11 obtains a digital bit stream through the HDMI (registered trademark) receiver 36 and the A/D converter 34, and converts it to digital sound signals (PCM signals) of five channels Lch (channel), Rch, Cch, LSch, and RSch, and then outputs the signals to the signal processing unit 12. In addition, DSP decoder 11 supports a variety of data formats such as AAC (registered trademark), Dolby Digital (registered trademark), DTS (registered trademark), MPEG-1/2, and MPEG-2 multi-channel, MP3 and decodes external input signals into 5 digital sound signals (PCM signals) by the not-shown decoder. In addition, for example, when the digital sound signals (PCM signals) of the five channels are directly inputted from a DVD player, the DSP decoder 11 outputs the signals to the signal processing unit 12.

The signal processing unit 12 is configured by the DSP and performs various signal processes such as adding the reverberation simulation signals with respect to the outputs of the DSP decoder 11. The digital sound signals processed in the signal processing unit 12 are outputted to the D/A converter 13.

The D/A converter 13 converts the seven digital sound signals of the Lch, the Rch, the Cch, the RLch, the RRch, the FLch, and the FRch which are inputted from the signal processing unit 12 into analog sound signals.

The low-pass filter 14 removes a folding noise (an aliasing noise) in a band more than Nyquist frequency from the respective analog sound signals generated in the D/A converter 13. The electronic volume 15 adjusts a volume of the signals of the channels outputted from the low-pass filter 14 in accordance with a control signal outputted from the controller 17 depending on an operation of the operating unit 19. The power amplifier 16 amplifies the analog sound signals adjusted by the electronic volume 15 and outputs the signals to the speakers 21 to 27.

The speakers 21 to 27 output the sounds on the basis of the analog sound signals outputted from the power amplifier 16. That is, the speaker 21 outputs the sound of the Lch, the speaker 22 outputs the sound of the Cch, the speaker 23 outputs the sound of the Rch, the speaker 24 outputs the sound of the FLch, the speaker 25 outputs the sound of the FRch, the speaker 26 outputs the sounds of the RLch and LSch, the speaker 27 outputs the sounds of the RRch and RSch, respectively.

The controller 17 controls each unit by the manipulation performed in the operating unit 19. For example, when an adjustment manipulation of a sound volume is operated in the operating unit 19, the controller 17 outputs the corresponding control signal to the electronic volume 15 so as to vary the sound volume emitted from the speakers 21 to 27. CPU and MPU are suitable for the controller 17. At this time, the controller 17 is embodied in software.

The microphone M is installed in a position of the user U. The microphone M, the A/D converter, and the sound field measuring unit 171 are sequentially connected in that order.

The microphone M is a non-directional microphone having 1 channel and converts a sound into an analog signal. The A/D converter 172 converts the audio signal into the digital signal. An input/output unit includes an interface and a memory, and stores temporally the digital signal.

The sound field measuring unit 171 causes the speakers 21 to 27 to output sequentially test sounds such as impulse sounds, and obtains the audio signals collected by the microphone M through the A/D converter 172. The obtained signals are response signals of the listening room from the speakers to the microphone M as a system. The sound field measuring unit 171 interprets the response signals and measures sizes of the sound signals and the frequency characteristics of direct sound components and indirect sound components. The direct sound components directly arrive at the microphone M from the speakers. The indirect sound components are reflected from a wall and then arrive at the microphone M from the speakers respectively.

The sound field measuring unit 171 measures levels of the direct sound components and the indirect sound components of the response signals of the speakers 21 to 27. By comparing the calculated values, unbalance of the direct sound and the reverberation sound can be detected when the sounds are outputted from the speakers 21 to 27.

The memory 18 stores the programs executed in the controller 17 or various data for controlling. The operating unit 19 is used for inputting such as adjusting various manipulations to the sound field controlling device 1 by the user. The display unit 20 is used for displaying a message to the user from the sound field controlling device 1.

As shown in FIG. 2, a configuration of the signal processing unit 12 will be explained. The signal processing unit 12 includes main signal lines 40 and a sound field generating device 121 so as to generate the front sound field and the surrounding sound field. The main signal lines 40 include filters 401 to 404 which adjust a frequency characteristic of the multi-channel audio signals.

The sound field generating device 121 includes a front sound field forming unit 52 which forms the front sound field at the front of the listener and a surrounding sound field forming unit 56 which forms the surrounding sound field. In addition, the sound field generating device 121 includes a subtractor 42 which generates a differential signal of signals of the LSch and RSch, and a front input signal synthesizing unit 44 which synthesizes the difference signal and signals of the Lch, Rch and Cch. The synthesized signal is inputted to the front sound field forming unit 52.

In addition, the sound field generating device 121 includes a front sound field signal level controlling unit 80 which controls balance of the levels of the output signals of the front sound field forming unit 52 and a surrounding sound field signal level controlling unit 81 which controls levels of the output signals of the surrounding sound field forming unit 56.

In addition, the signal processing unit 12 includes adders 62 to 65 and filters 91 to 94. The adders 62 to 65 add the outputs of the front sound field signal level controlling unit 80 and the outputs of the surrounding sound field signal level controlling unit 81. The filters 91 to 94 adjust a frequency characteristics of the reverberation effect sounds forming the front sound field and the surrounding sound field. In addition, the signal processing unit 12 further includes an adder 95 and an adder 96 which add outputs of signals of the RLch, RRch of the adders 62 to 65 and the audio signal channels of the LSch and the RSch in a back direction.

Digital sound signals of five channels are generated by the DSP decoder 11 and are transferred to the D/A converter 13 through the main signal lines 40. The frequency characteristics in the signals having five channels are adjusted by filters 401 to 404 provided in the middle of transmitting the signal. The filters 401 to 404 adjust the frequency characteristic of each channel of L, R, LS and RS of the multi-channel audio signals depending on an equalizer gain indicated by the controller 17. The equalizer gain is set in accordance with the measured result of the sound field measuring unit 171 by the controller 17. In addition, the reverberation simulation signals such as RLch, RRch are added to the output of the filters 403 and 404 of the filters 401 to 404 by the adders 95, 96.

The front input signal synthesizing unit 44 synthesizes a difference signal (LS−RS) outputted from the subtractor 42 and the signals of the Lch, Cch and Rch out of input signals with directly or with weighting coefficient. The synthesized signal is referred as a synthesized front signal F. Herein, since the difference signal (LS−RS) includes the reverberation component as a major component and the difference signal is obtained to the front signal with a proper quantity so as to substantially deepen a depth of the front sound field generated in the front sound field forming unit 52, the difference signal (LS−RS) between the surrounding channels is inputted to the front input signal synthesizing unit 44.

The surrounding input signal synthesizing unit 48 synthesizes the difference signal (L-R) outputted from the subtractor 46 and the surrounding signals LS, RS out of the input signals with directly or with weighting coefficient. The synthesized signal is referred as a synthesized surrounding signal S. In addition, the surrounding input signal synthesizing unit 48 outputs the synthesized signal to the surrounding sound field forming unit 56.

Herein, the reason the difference signal (L-R) of the front signal is inputted to the surrounding input signal synthesizing unit 48 is that the difference signal (L-R) includes the reverberation component as a major component and a depth of the surrounding sound field generated in the surrounding input signal synthesizing unit 48 is substantially deepened by incorporating the reverberation component into the surrounding signal with a proper quantity.

The front sound field forming unit 52 includes a reflected sound parameter memory 72 and a convolution operating unit 74. Since the reverberation is the thing that a plurality of the reflected sound are synthesized, the front sound field forming unit 52 generates a reverberation simulation signal for forming the front sound field in a front direction of the listening position of the user U by synthesizing simulation signals of a plurality of reflected sound of the synthesized front signal F. The configuration information regarding the plurality of reflected sounds is stored in the reflected sound parameter memory 72 as a reflected parameter. The convolution operating unit 74 includes an FIR filter. The reflected sound parameter is set as a filter coefficient. A convolution operation of the filter is performed with respect to the synthesized front signal F. Accordingly, the convolution operating unit 74 outputs the result of the convolution operation to the front sound field signal level controlling unit 80.

The surrounding sound field forming unit 56 includes a reflected sound parameter memory 76 and a convolution operating unit 78. Since the reverberation is the thing that a plurality of the reflected sound are synthesized, the surrounding sound field forming unit 56 generates the reverberation simulation signal for forming the surrounding sound field in the front direction of the listening position of the user U by synthesizing simulation signals of the plurality of the reflected sound of the synthesized surrounding signal S. The configuration information regarding the plurality of the reflected sound is stored in the reflected sound parameter memory 76 as a reflected sound parameter. The convolution operating unit 78 includes the FIR filter. The reflected sound parameter is set as the filter coefficient. The convolution operation of the filter is performed with respect to the synthesized surrounding signal S. Accordingly, the convolution operating unit 78 outputs the result of the convolution operation the signal to the surrounding sound field signal level controlling unit 81.

The convolution operating unit 74 of the front sound field forming unit 52 and the convolution operating unit 78 of the surrounding sound field forming unit 56 may be configured by one step FIR filter or a plurality of FIR filters connected in series.

The front sound field level controlling unit 80 adjusts the levels of the reverberation simulation signals FL1, FR1, RL1, RR1 generated from the front sound field forming unit 52 on the basis of the levels of the direct sound components and the indirect sound components obtained from the sound field measuring unit 171. That is, since the reverberation simulation signal strengthens the indirect sound component, the level of the reverberation simulation signal is adjusted so that the indirect sound component is balanced in the speakers direction of the listening room (in addition, so that a ratio of the direct sound component is properly balanced in the speakers directions). The adjusted reverberation simulation signals FL3, FR3, RL3 are RR3 are outputted to the adders 62 to 65.

The surrounding sound field signal level controlling unit 81 adjusts the level of the reverberation simulation signals FL2, FR2, RL2 and RR2 generated from the surrounding sound field forming unit 56 on the basis of the levels of the direct sound component and the indirect sound component obtained from the sound field measuring unit 171. That is, since the reverberation simulation signal strengthens the indirect sound component, the level of the reverberation simulation signal is adjusted so that the indirect sound component is balanced in the speakers direction of the listening room (in addition, so that a ratio of the direct sound component is properly balanced in the speakers direction). The adjusted reverberation simulation signal FL4, FR4, RL4 and RR4 are outputted to the adders 62 to 65.

The adders 62 to 65 synthesize the reverberation simulation signals FL3, FR3, RL3, RR3 outputted from the front sound field level controlling unit 80 and the reverberation simulation signals FL4, FR4, RL4, RR4 outputted from the surrounding sound field level controlling unit 81 to output the synthesized signals to filters 91 to 94 respectively.

The filters 91 to 94 are IIR filters (Infinite Impulse Response) and adjust the synthesized frequency characteristic of the reverberation simulation signals outputted from the adders 62 to 65 on the basis of the measured result of the sound field measuring unit 171.

The adder 95 synthesizes the reverberation simulation signal of the RLch outputted from the filter 93 and a left surrounding signal LS which is one of the multi-channel sound signals to output the synthesized signal to the D/A converter 13. The adder 96 synthesizes the reverberation simulation signal of the RRch outputted from the filter 94 and a right surrounding signal RS which is one of the multi-channel sound signals to output the synthesized signal to the D/A converter 13.

Next, an operation procedure of the sound field measuring unit 171 of the sound field controlling device according to the embodiment will be described by using a flow chart of FIG. 3.

In ST1, a display for guiding to set the microphone M is displayed on the display unit 20. For example, "Set a microphone to a listening position." is displayed on the display unit 20. In ST2, it is determined that whether a confirming manipulation in which a set of the microphone M is confirmed is performed by the operating unit 19. When the confirming manipulation is not performed, the ST2 is set to N and waits. When the ST2 is set to Y, the next step is performed. In ST3, one channel is sequentially selected among the Lch, the Rch, the LSch, and the RSch corresponding to speakers 21, 23, 26, and 27. Then, the test sound is inputted to the selected channel to generate a test sound from the speakers L, R, RL, and RR of the each channel. An impulse sound or a time stretch pulse is used as the test sound. In ST4, a response signal of the test sound collected from the microphone M is stored. The response signals in the direction of the speakers are obtained by repeating the ST3 and the ST4 at the each speaker.

Figure 3:
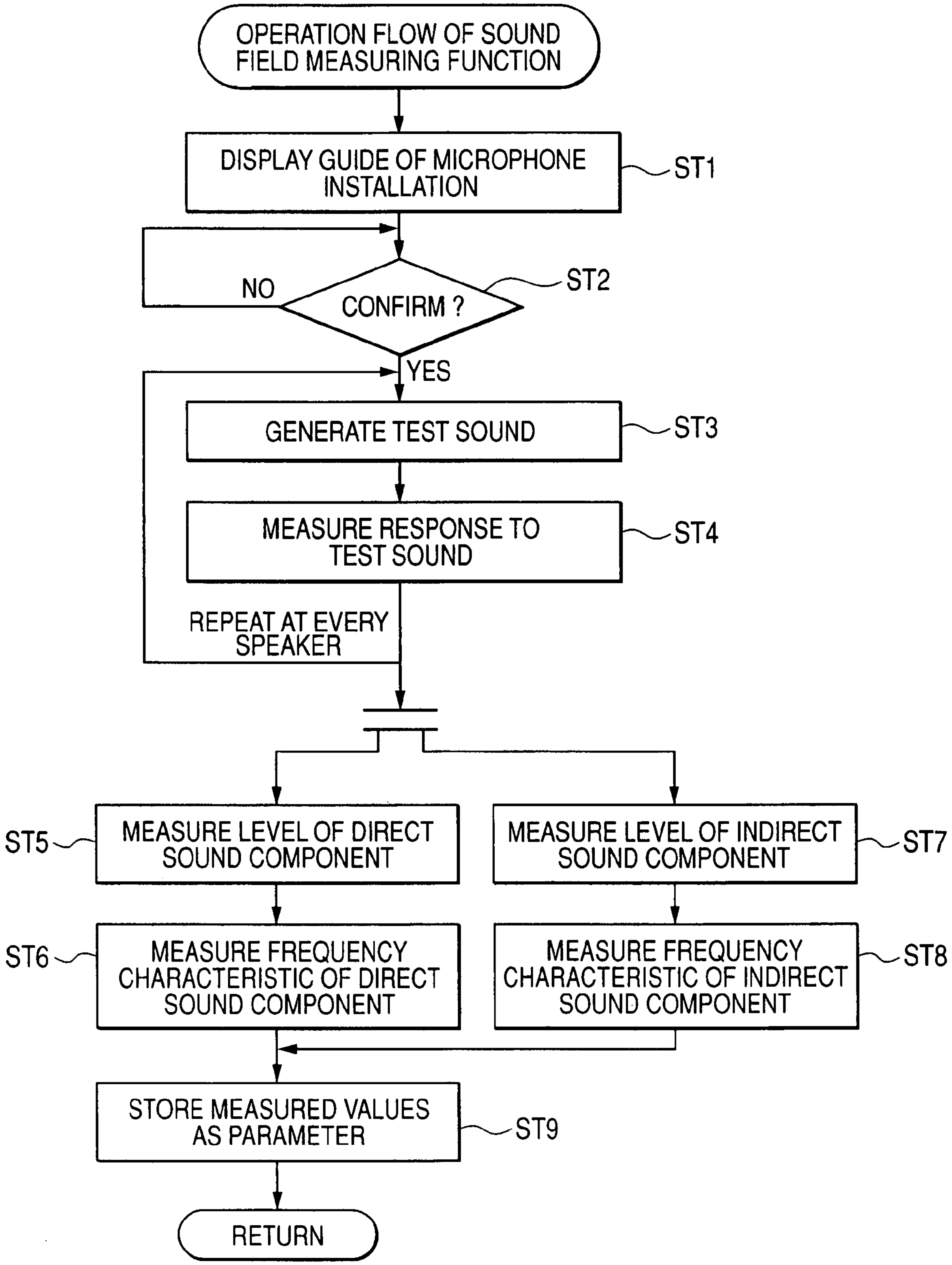
FIG. 3 is an operation flow illustrating a sound field measuring unit of the sound field controlling unit according to the embodiment.

In an example of FIG. 3, following ST5 and ST6 are performed in parallel with ST7 and ST8.

In ST5, a level of the direct sound component of the stored response signal is measured. In particular, data in the range of initial 10 to 30 milliseconds corresponding to the direct sound component is extracted to calculate an integral value of the level and a time average value of the level. The calculation is performed at each speaker. In ST 6, the frequency characteristic of the direct sound component of the stored response signal is measured. Specifically, in the same manner with the ST5, the data in the range of initial 10 to 30 milliseconds corresponding to the direct sound component is extracted to calculate the frequency characteristic by performing a fourier transform about the data. The calculation is performed at each speaker.

In ST7, the level of the indirect sound component of the stored response signal is measured. Specifically, the data in the range of initial 10 to 30 milliseconds corresponding to the direct sound component is skipped, the level of the integral value is calculated about the data during the 100 milliseconds following the initial 10 to 30 milliseconds, and then a time average value of the level is calculated. The calculation of the average value is performed at each speaker. In ST8, the frequency characteristic of the indirect component is calculated among the stored response signal. In the same manner with the ST7, the data in the range of initial 10 to 30 milliseconds corresponding to the direct sound component is skipped and the frequency characteristic is calculated by performing the fourier transform about the data during the following 100 milliseconds. The calculation is performed at each speaker.

In ST9, the calculated values from the ST5 to the ST8 are stored as a set of parameter. In addition, ratios between the direct sound component and the indirect sound component are obtained and the ratios are stored every the L, R, RL, RR (the method of adjusting the level by using the value will be explained below in the description of FIG. 4).

In addition, executions of ST5 to ST8 are independently of an order. The calculation may be executed at every speaker. In addition, the whole step from the ST3 to ST8 may be repeatedly executed at every speaker in addition to the ST3 and the ST4.

<Description of Compensating Method of Frequency Characteristic by Controller>

The filters 401 to 405 and the filters 91 to 94 are equalizer filters for adjusting the frequency characteristic. Hereinafter, referring back to FIG. 2, an adjusting method of adjusting an equalizer gain will be explained. In principle, an inverse filter of the frequency filter of each speaker in the measured listening room 101 is set to the equalizer gain. The frequency characteristic is measured by the sound field measuring unit 171. However, when frequency characteristics of the sound signals of the L, R, C, LS, RS of the multi-channel sound signal are adjusted (hereinafter, the signal is referred as "direct signal"), the frequency characteristics may be flat. However, the signals may have a lot of loss in music. For example, when the frequency characteristic of the listening room 101 has a dip and the characteristic of the filters 401 to 404 have a peak so as to compensate for the dip, the frequency characteristic may be flat. However, the user U may feel that the sound is unpleasant or unnatural (harsh to hear).

Accordingly, it is preferable that the sound field controlling device 10 of the embodiment allocates more than half of an adjustment quantity of the filter characteristic (equalizer gain) of compensating for the frequency characteristic of the direct signal to the filters 91 to 94 which adjust the frequency characteristic of the reverberation simulation signal.

Figure 4:
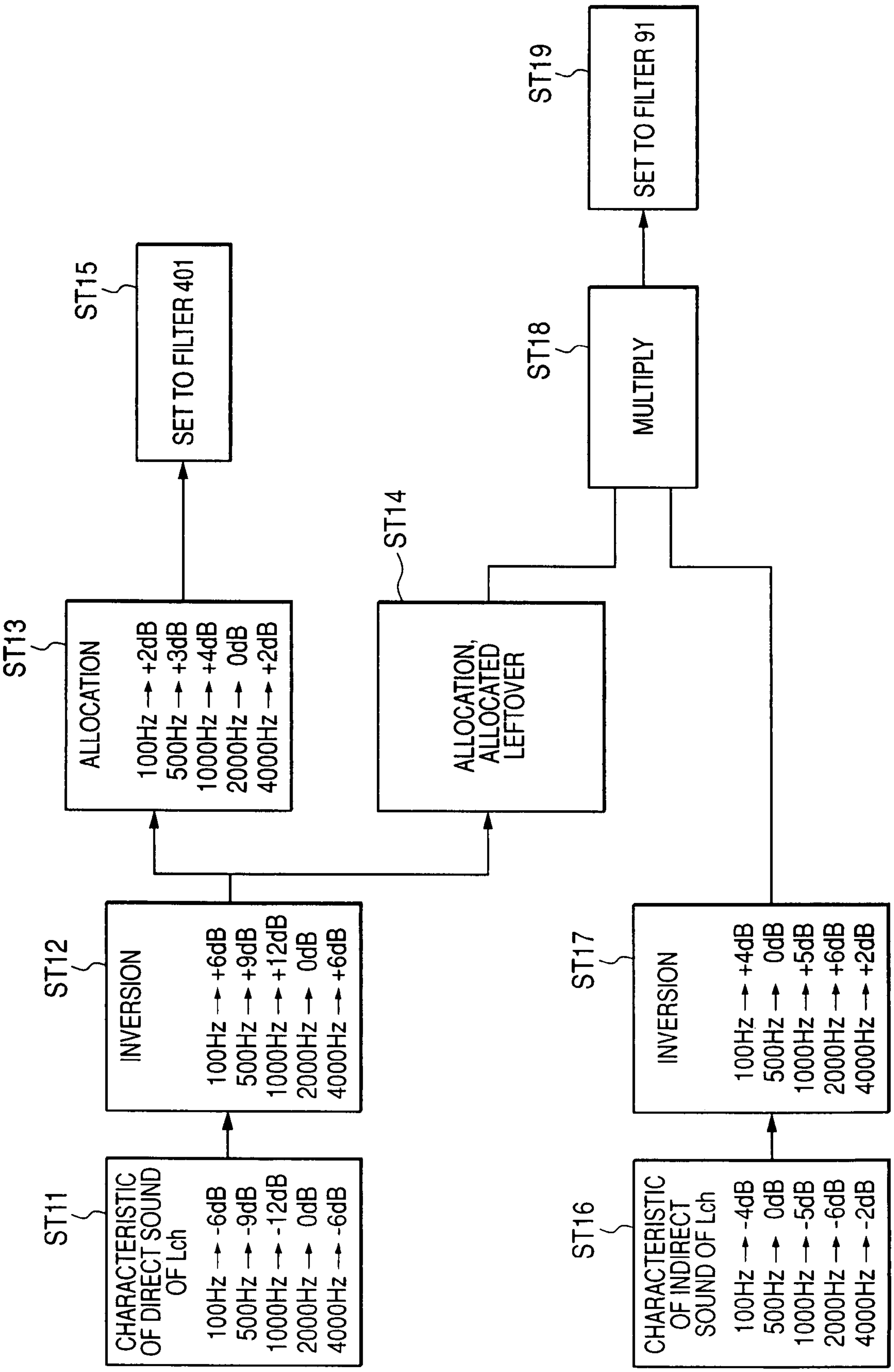
FIG. 4 is a flow illustrating a method of adjusting an equalizer gain of a filter in the sound field controlling unit according to the embodiment.

With reference to FIG. 4, a setting method of the equalizer gains of the filters 401 to 404 and the filters 91 to 94 will be specifically explained. FIG. 4 is a flow chart illustrating a setting method related to the Lch. In the flow chart, the equalizer gain is set to the filter 401 for adjusting the frequency characteristic of the direct output of the Lch and the filter 91 for adjusting the reverberation simulation signal outputted from the FLch speaker 24 disposed in an upper position of the Lch.

(ST11) The frequency characteristic of the direct sound component among the sound field transferred from the Lch is measured by using the sound field measuring unit 171. The manipulation corresponds to the operation of ST6 shown in FIG. 3.

(ST12) The inverse filter of the frequency characteristic obtained from the ST11 is calculated, and the gain is adjusted so that a minimum value of the gain is set to 0 dB.

(ST13, ST14) The gain obtained from the ST12 is allocated to the filter 401 and the filter 91. A dB value in which a part of the gain is subtracted for a direct signal obtained from the ST12 is allocated to the filter 401 and the filter 91 as equalizer values of the filter 401 (ST13). In FIG. 4, one third [dB value] obtained from the ST12 is allocated. In ST14, when the output of the sound field controlling device 10 is matched by allocating the values to the filter 401 and the filter 91, the equalizer gain of the filter 91 is allocated so that power levels of the every frequency of the direct sound component at the listening position are flat.

(ST15) The value of the equalizer gain obtained from the ST 13 is converted so that the peak is set to 0 dB and then the converted value is set as a value of the equalizer gain of the filter 401.

Accordingly, when setting the filter 401, an amount of decreasing the adjustment quantity of the frequency characteristic regarding the direct signal is supplemented by adjusting the frequency characteristic regarding the reverberation simulation signal. Accordingly, an irregularity of the sound quality of the direct sound is reduced, and the direct sound component of the sound to which the listener listens may be natural.

(ST16) The frequency characteristic of the indirect sound component is measured among the sound field transferred from the Lch by using the sound field measuring unit 171. The manipulation corresponds to the operation of the ST8 shown in FIG. 3.

(ST17) The inverse filter of the frequency characteristic obtained from the ST11 is calculated and then the gain is adjusted so that the minimum gain value is set 0 dB.

(ST18) The equalizer gain is calculated by multiplying the gain obtained from the ST17 and the gain allocated to the filter 91 in the ST14.

(ST19) The filter 91 is set so that the peak of the gain obtained from the ST 18 becomes 0 dB.

<Supplement Explanation of Compensating Method of Frequency Characteristic in Accordance With Controller>

The setting of the Lch is described in the description corresponding to FIG. 4. The adjustment quantity is similarly set to the filter 402 for adjusting the frequency characteristic of the Rch and the FRch disposed in the upper position of the Rch and the filter 92. Further, in the RLch speaker, the output of the filter 403 of the LSch and the output of the filter 93 of the RLch (the output of the adder 65) are synthesized by the adder 95. The filter 403 and the filter 93 are similarly set by using the same method as shown in FIG. 4. Further, in the RRch speaker, the output of the filter 404 of the RSch and the output of the filter 94 of the RRch (the output of the adder 65) are synthesized by the adder 96. The filter 94 and the filter 404 are similarly set by using the same method as shown in FIG. 4.

<Supplement Explanation of Sound Field Controlling Unit According to Embodiment>

In addition, the multi-channel sound signals are inputted to the front input signal synthesizing unit 44 and the surrounding input signal synthesizing unit 48 directly. However, the signal may be inputted after adjusting the gain, the frequency characteristic, and the phase characteristic thereof.

In addition, since the sound field is divided into the surround and the front, the sound field controlling unit according to the embodiment includes the front sound field forming unit 52 and the surrounding sound field forming unit 56 separately. However, the method of dividing the sound field and the method of controlling the same is not limited. A sound field forming unit (equivalent to the surrounding sound field forming unit 56) may be provided at every sound field. For example, the sound field is measured at every speaker, and a sound forming unit having same function as the surrounding sound field forming unit 56 may be provided.

In addition, a synthesizing of the front input signal synthesizing unit 44, a synthesis ratio of the surrounding input signal synthesizing unit 48, and adding a weighting may be dynamically performed by monitoring the source.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2006-126870 filed on Apr. 28, 2006, the contents of which are incorporated herein for reference.

What is claimed is:

1. A sound field controlling device for supplying audio signals to a plurality of speakers provided in a space to form a sound field in the space, the device comprising:

a measuring unit which measures levels of indirect sounds, which are outputted from the speakers, reflected from a wall surface of the space, and reach a listening position respectively;

a reverberation applying unit which generates a reverberation simulation signal by convolving an audio signal having a difference signal of a Right channel signal and a Left channel signal in the plurality of audio signals with a filter coefficient which simulates a predetermined reverberation characteristic; and a reverberation balance adjusting unit which controls the level of the reverberation simulation signal on the basis of the levels of the indirect sounds from the speakers measured by the measuring unit so that respective synthesized levels of synthesized signals of the indirect sounds and the reverberation simulation signal are balanced between the speakers.

2. The sound field controlling device according to claim 1, wherein the audio signals supplied to the plurality of speakers are multi-channel audio signals; and wherein the reverberation applying unit generates the reverberant simulation signal on the basis of a signal obtained by synthesizing a part or all of the multi-channel audio signals.

3. A sound field controlling device comprising: a direct supply unit which supplies an inputted audio signal to a speaker; a measuring unit which measures a frequency characteristic of a sound when the sound outputted from the speaker arrives at a listening position; a reverberation applying unit which generates a reverberation sound of the audio signal by convolving an audio signal having a difference signal of a Right channel signal and a Left channel signal in the plurality audio signals with a filter coefficient which simulates a predetermined reverberation characteristic; and a reverberation balance adjusting unit which controls the level of the reverberation simulation signal corresponding speakers on the basis of the levels of the indirect sounds from the speakers measured by the measuring unit so that respective synthesized levels of synthesized signals of the indirect sounds and the reverberation simulation signal are balanced between the speakers; and a filter which filters the reverberation sound with a filter characteristic of compensating for a part or all of the measured frequency characteristic to supply the filtered reverberation sound to the speaker.

4. The sound field controlling device according to claim 3, wherein the direct supply unit supplies inputted multi-channel audio signals to different speakers respectively; and wherein the measuring unit and the filter are provided as many as the number of the channels of the multi-channel audio signals.

5. The sound field controlling device according to claim 4, wherein the reverberation applying unit generates a reverberation simulation signal on the basis of a signal obtained by synthesizing a part or all of the multi-channel audio signals.

6. The sound field controlling device according to claim 3, wherein the filter is set with the filter characteristic of compensating for a part of the measured frequency characteristic; and wherein the direct supply unit includes a direct sound filter which adjusts the frequency characteristic of the audio signal with the filter characteristic compensating for a part of the measured frequency characteristic.

* * * * *